United States Patent
Chen et al.

(10) Patent No.: US 9,735,545 B1
(45) Date of Patent: Aug. 15, 2017

(54) VERTICAL CAVITY SURFACE EMITTING LASER WITH COMPOSITE REFLECTORS

(71) Applicant: NORTHROP GRUMMAN SYSTEMS CORPORATION, Falls Church, VA (US)

(72) Inventors: Yaochung Chen, Rancho Palos Verdes, CA (US); Vincent Gambin, Torrance, CA (US); Xianglin Zeng, Monterey Park, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/206,041

(22) Filed: Jul. 8, 2016

(51) Int. Cl.
    H01S 5/00   (2006.01)
    H01S 5/183  (2006.01)
    H01S 5/187  (2006.01)
    H01S 5/042  (2006.01)
    H01S 5/343  (2006.01)

(52) U.S. Cl.
    CPC ........ H01S 5/18369 (2013.01); H01S 5/0421 (2013.01); H01S 5/0425 (2013.01); H01S 5/187 (2013.01); H01S 5/18377 (2013.01); H01S 5/34313 (2013.01); H01S 5/183 (2013.01); H01S 5/18308 (2013.01); H01S 5/18344 (2013.01); H01S 2304/02 (2013.01); H01S 2304/04 (2013.01)

(58) Field of Classification Search
    CPC .. H01S 5/18369; H01S 5/183; H01S 5/18308; H01S 5/18344; H01S 5/18377; H01S 5/0421; H01S 5/0425; H01S 5/187; H01S 5/34312; H01S 2304/02; H01S 2304/04
    See application file for complete search history.

(56) References Cited

U.S. PATENT DOCUMENTS

| 4,949,350 A | 8/1990 | Jewell et al. |
| 5,063,569 A | 11/1991 | Xie |
| 5,068,868 A | 11/1991 | Deppe et al. |

(Continued)

OTHER PUBLICATIONS

Yu, H. C. et al. "1.3-μm InAs—InGaAs Quantum-Dot Vertical-Cavity Surface-Emitting Laser with Fully Doped DBRs Grown by MBE" IEEE Photonics Technology Letters, vol. 18, No. 2, Jan. 15, 2006, pp. 418-420.

(Continued)

*Primary Examiner* — Kinam Park
(74) *Attorney, Agent, or Firm* — John A. Miller; Miller IP Group, PLC

(57) ABSTRACT

A vertical cavity surface emitting laser (VCSEL) including a substrate and a bottom distributed Bragg reflector (DBR) having a plurality of layers deposited on the substrate. The VCSEL also includes a first charge confining layer deposited on the bottom DBR, an active region deposited on the first charge confining layer, and a second charge confining layer deposited on the active region. A current blocking layer is provided on the second charge confining layer, and a top epitaxial DBR including a plurality of top epitaxial DBR layers is deposited on the current blocking layer. A top electrode is deposited on the top epitaxial DBR, a bottom electrode is deposited on the bottom DBR and adjacent to the active region, and a top dielectric DBR is deposited on the top epitaxial DBR and the top electrode.

20 Claims, 3 Drawing Sheets

(56) References Cited

U.S. PATENT DOCUMENTS

| | | |
|---|---|---|
| 5,164,949 A | 11/1992 | Ackley et al. |
| 5,444,731 A | 8/1995 | Pfister |
| 5,712,865 A * | 1/1998 | Chow .................... B82Y 20/00 372/45.01 |
| 5,818,862 A | 10/1998 | Salet |
| 5,915,165 A | 6/1999 | Sun et al. |
| 5,985,686 A | 11/1999 | Jayaraman |
| 6,549,553 B1 | 4/2003 | Uenohara et al. |
| 6,680,963 B2 | 1/2004 | Liao et al. |
| 6,906,353 B1 | 6/2005 | Shieh et al. |
| 6,914,925 B2 | 7/2005 | Shinagawa et al. |
| 6,931,042 B2 | 8/2005 | Choquette et al. |
| 7,020,172 B2 | 3/2006 | Naone et al. |
| 7,072,376 B2 | 7/2006 | Caneau et al. |
| 7,352,787 B2 | 4/2008 | Mukoyama et al. |
| 7,376,164 B2 | 5/2008 | Takahashi |
| 7,556,976 B2 | 7/2009 | Taylor et al. |
| 7,595,516 B2 | 9/2009 | Taylor et al. |
| 7,816,163 B2 | 10/2010 | Schmid et al. |
| 7,885,307 B2 | 2/2011 | Tanabe et al. |
| 8,031,754 B2 * | 10/2011 | Iwai ...................... B82Y 20/00 372/102 |
| 8,168,456 B2 | 5/2012 | Johnson et al. |
| 8,218,596 B2 | 7/2012 | Oki et al. |
| 8,355,421 B2 | 1/2013 | Kawakita et al. |
| 8,654,812 B2 | 2/2014 | Fattal et al. |
| 2003/0048824 A1 | 3/2003 | Shinagawa et al. |
| 2003/0096439 A1 | 5/2003 | Lee et al. |
| 2003/0156613 A1 | 8/2003 | Uenohara et al. |
| 2007/0091959 A1 | 4/2007 | Royo |
| 2009/0116526 A1 * | 5/2009 | Hashimoto ......... H01S 5/18369 372/46.01 |
| 2009/0180509 A1 * | 7/2009 | Kise .................... H01S 5/18327 372/50.124 |
| 2012/0082178 A1 | 4/2012 | Tamanuki |
| 2013/0272337 A1 | 10/2013 | Tan et al. |
| 2015/0014632 A1 * | 1/2015 | Kim .................... H01L 33/0004 257/24 |
| 2015/0091037 A1 * | 4/2015 | Jung .................... H01L 33/405 257/98 |
| 2015/0171197 A1 | 6/2015 | Taylor |

OTHER PUBLICATIONS

Nishiyama, N. et al. "Long-Wavelength Vertical-Cavity Surface-Emitting Lasers on InP with Lattice Matched AlGaInAs—InP DBR Grown by MOCVD" IEEE Journal of Selected Topics in Quantum Electronics, vol. 11, No. 5, Sep./Oct. 2005, pp. 990-998.

Wistey, M. A. et al. "Monolithic, GaInNAsSb VCSELs at 1.46 μm on GaAs by MBE" Electronics Letters, vol. 39, No. 25, Dec. 11, 2003, 2 pgs.

* cited by examiner

VERTICAL CAVITY SURFACE EMITTING LASER WITH COMPOSITE REFLECTORS

BACKGROUND

Field

This invention relates generally to a vertical cavity surface emitting laser (VCSEL) and, more particularly, to a VCSEL that includes a top distributed Bragg reflector (DBR) having a plurality of epitaxial DBR layers and a plurality of dielectric DBR layers.

Discussion

VCSEL devices are well known semiconductor lasers that emit a laser beam perpendicular to a top surface of the device as opposed to conventional edge-emitting semiconductor lasers. VCSEL devices have a number of applications in the art, such as optical sources for communications and data transmission purposes on a fiber optic cable. Known VCSEL devices are typically effective as a laser source. However, improvements can be made. For example, a typical VCSEL device has electrodes that are separated from the active region of the device by DBR layers. However, the DBR layers are generally relatively thick and add a large undesirable series resistance that significantly reduces the lasing efficiency of the device.

DETAILED DESCRIPTION OF THE EMBODIMENTS

The following discussion of the embodiments of the invention directed to a VCSEL device is merely exemplary in nature, and is in no way intended to limit the invention or its applications or uses.

Figure 4:
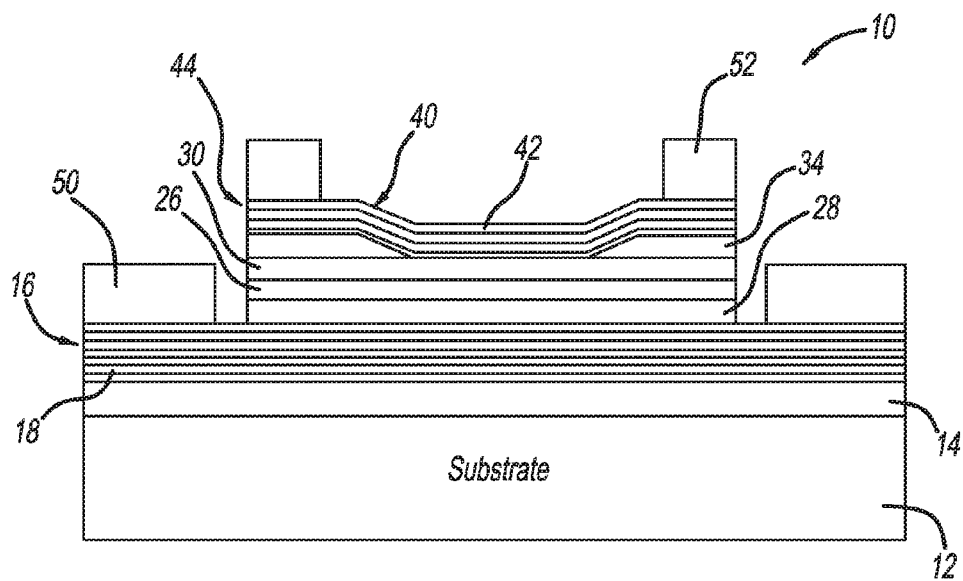
Figure 5:
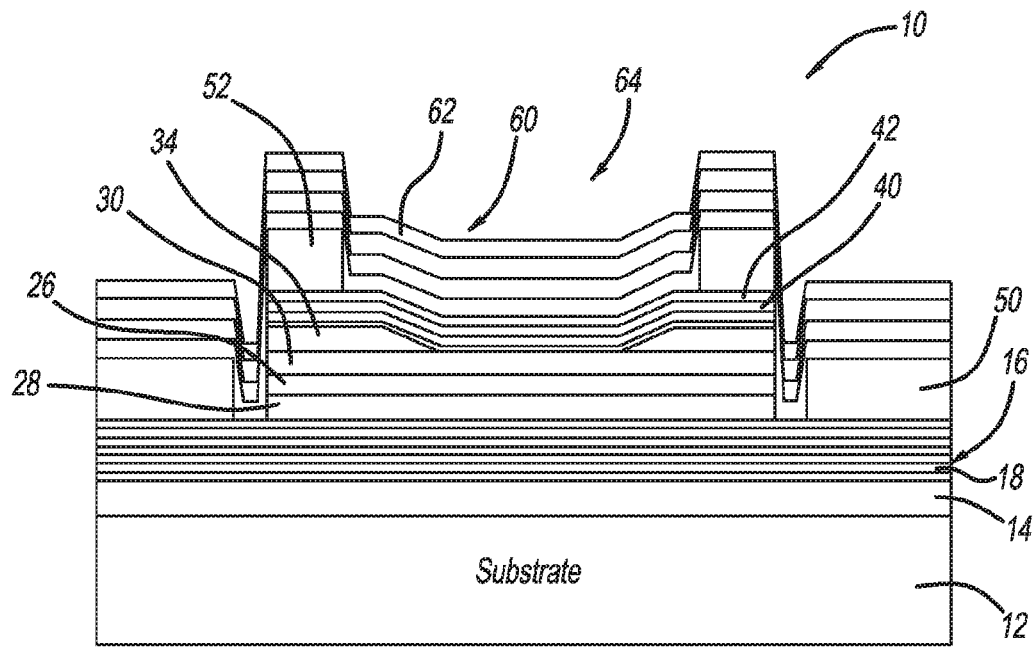
FIG. 5 is a layer profile view of the VCSEL device.

FIGS. 1-4 are a series of profile views showing a VCSEL device 10 at various stages of the fabrication of the device 10, and FIG. 5 is a profile view of the device 10 at or near its final stage of fabrication. The device 10 includes a substrate 12 that may be, for example, a single crystal, doped or undoped, gallium arsenide (GaAs) wafer. The process for depositing the epitaxial layers on the substrate 12 discussed herein may include molecular beam epitaxy (MBE) or metal organic chemical vapor deposition (MOCVD). A buffer layer 14 is deposited or grown on the substrate 12 to a thickness of, for example, less than 0.5 μm and is typically the same material as the substrate 12. The buffer layer 14 reduces defects in the substrate 12 that may otherwise affect semiconductor layer growth to improve the quality of the layers that are subsequently deposited.

A bottom DBR 16 is deposited on the buffer layer 14 opposite to the substrate 12 to provide a highly reflective semiconductor reflecting structure that reflects photons generated by the active regions of device 10. The bottom DBR 16 is formed of several pairs of alternating high refractive index and low refractive index layers 18, such as, for example, twenty alternating pairs of low index of refraction AlGaAs layers and high index of refraction GaAs layers. Only seven of the layers 18 are shown for illustration purposes. Some of the pairs of the layers 18 at the top of the bottom DBR 16 are doped to form an n-type or p-type conducting region 20 to provide ohmic contacts for optimal current flow. By only doping some of the layers 18 in the bottom DBR 16, free carrier absorption can be reduced in the bottom DBR 16.

The lasing operation of the device 10 occurs in an active region 26 that is confined between a lower charge confining layer 28 deposited on the bottom DBR 16 and a top charge confining layer 30, as shown. As is known by those skilled in the art, the active region 26 can be defined by a series of multiple quantum well layers that include a semiconductor material, such as InGaAs, sandwiched between semiconductor layers having a wider band gap, such as GaAs, which confines charge carriers in two dimensions. In one non-limiting embodiment, the active region 26 includes four quantum well layers, where each quantum well layer includes an InGaAs layer sandwiched between two GaAs layers.

Charge carriers, i.e., electrons and holes, are injected into the active region 26 from lower and upper ohmic contact layers, discussed below. Electrons and holes recombine in the active region 26 to produce light. As is known, photons generated by the recombination of electrons and holes in the active region 26 are out of phase with each other, but when reflected between opposing DBRs, a standing-wave of coherent light is created. In one embodiment, the charge confining layers 28 and 30 are AlGaAs layers having a graded composition to produce a graded band gap, where the lower charge confining layer 28 has a composition for a high band gap near the bottom DBR 16 and a low band gap adjacent to the active region 26, and the upper charge confining layer 30 has a composition for a low band gap adjacent to the active region 26 and a high band gap opposite to the active region 26 so that the charge confining layers 28 and 30 operate to confine electrons and holes in the active region 26. The thickness of the multiple layers in the charge confining layers 28 and 30 would depend on the wavelength of light being generated and the application of the device 10.

Figure 1:
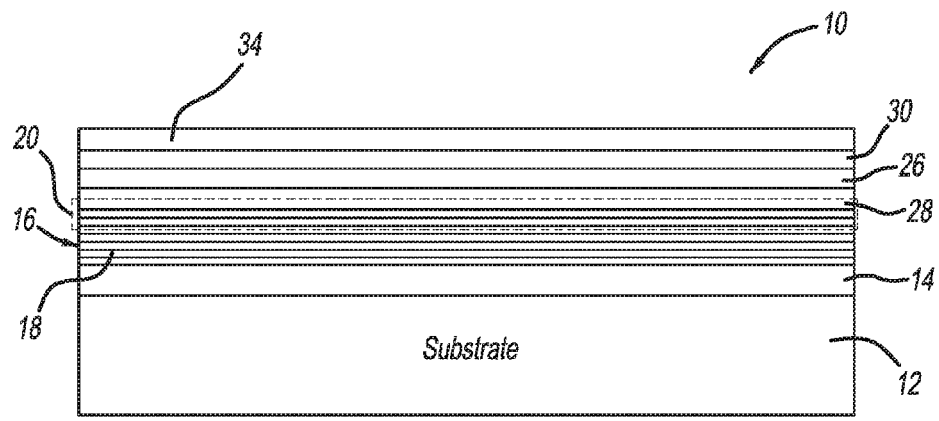
FIGS. 1-4 show fabrication steps of a VCSEL device.
Figure 2:
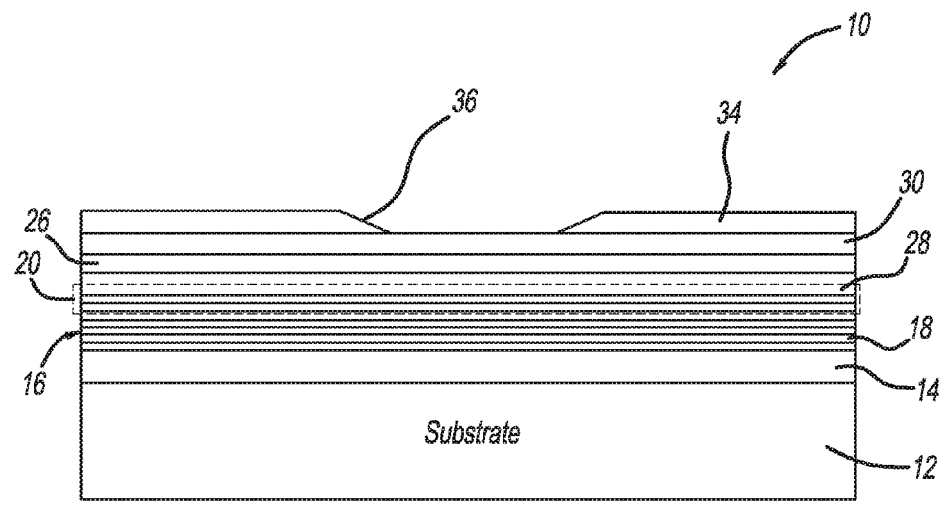
Figure 3:
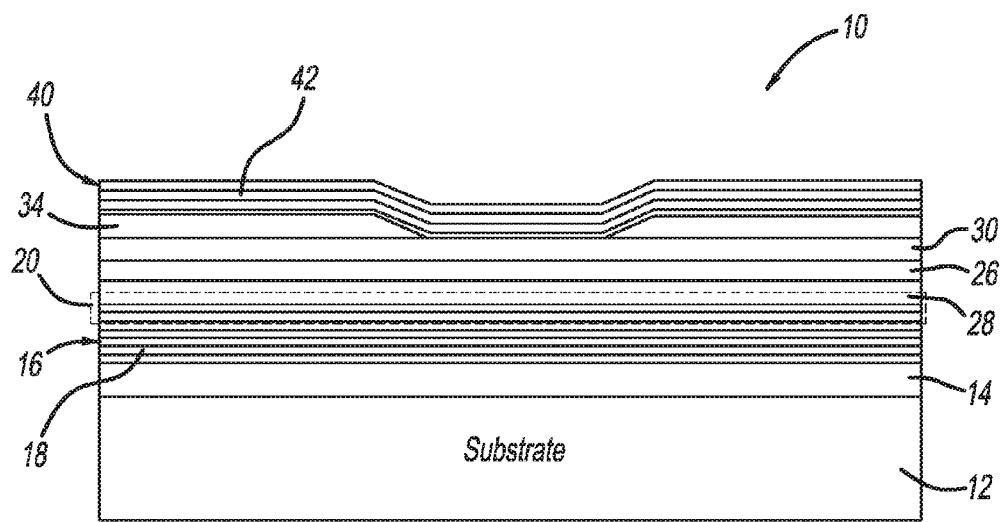

A current blocking layer 34 is deposited on the top charge confining layer 30, and is a non-conductive layer having a band gap larger than the energy of the photons that are generated to provide current blocking, where the layer 34 may be a single crystal semiconductor layer or an oxidized amorphous layer. A center portion of the current blocking layer 34 is etched to define an aperture 36, as shown in FIG. 2, to define a current injection aperture that defines the size and the shape of the laser beam emitted from the device 10.

A top epitaxial DBR 40 is deposited on the current blocking layer 34 that includes a plurality of doped semiconductor layers 42, here four, which form the bottom portion of a top DBR and provide a conduction path between a top electrode and the active region 26 as will be discussed in more detail below. The top epitaxial DBR 40 includes the same type and configuration of layers as the bottom DBR 16. After the top epitaxial DBR 40 is deposited, a photolithography process and recess etch are performed to define a mesa 44 that includes the current blocking layer 34, the top charge confining layer 30, the bottom charge confining layer 28, the active region 26 and the top epitaxial DBR 40, which exposes a portion of the bottom DBR 16, as shown in FIG. 4. A metallization process is then performed to provide a bottom ring electrode 50 on the bottom DBR 16 and a top ring electrode 52 on the top epitaxial DBR 40, as shown. The doped layers in the top and bottom DBRs 16 and 40 are of a different type, i.e., if the bottom DBR 16 is doped n-type, then the top DBR 40 is doped p-type, and vice versa.

Figure 6:
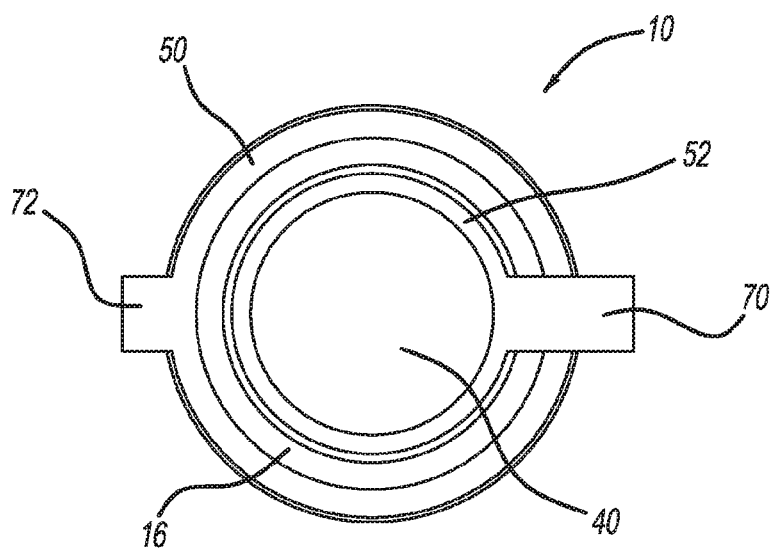
FIG. 6 is a top view of the VCSEL device showing top and bottom electrodes.

FIG. 6 is a top view of the device 10 to better illustrate the top ring electrode 52 and the bottom ring electrode 50. In this illustration, a connecting tab 70 extends from the top electrode 52, and crosses over the bottom electrode 50 as an air-bridge structure. Further, a connecting tab 72 extends from the bottom electrode 50. An electrical potential provided to the top and bottom electrodes 50 and 52 creates a current flow through the device 10 provided by the electrical conductivity of the doped regions, where the current flow does not flow through the current blocking layer 34, but flows through the aperture 36 to provide the charge injection into the active region 26.

Once the mesa 44 and the top and bottom electrodes 50 and 52 are formed, then a top dielectric DBR 60 is deposited on the top epitaxial DBR 40, where the top dielectric DBR 60 includes a plurality of layers 62 that have alternating pairs of a high refractive index layer and a low refractive index layer, where only four of the layers 62 are shown for illustration purposes. In one embodiment, the layers 62 are formed of a high refractive index SiN layer and a low refractive index $SiO_2$ layer that are deposited by plasma vapor deposition (PVD) or chemical vapor deposition (CVD) processes. The top dielectric DBR 60 covers the entire top of the device 10, and particularly covers the top epitaxial DBR 40, the top electrode 52 and the bottom electrode 50, as shown in FIG. 5. The combination of the top epitaxial DBR 40 and the top dielectric DBR 60 combine to form a complete top DBR 64 that has the reflective characteristics necessary for a proper VCSEL device.

By fabricating the top DBR 64 in this manner, only some of the layers in the top DBR 64 require the MBE or MOCVD processing steps, while the remaining layers in the top DBR 64 are fabricated by the less expensive deposition of dielectric layers. Further, by separating the top DBR 64 into the top epitaxial DBR 40 and the dielectric DBR 60, the top DBR 64 can be tuned for a specific wave length emission characteristic. Also, the dielectric DBR 60 not only reduces free carrier absorption in the top DBR 64, but also allows in-process measurements to acquire data for top DBR layer thickness tuning. The dielectric DBR layers 62 also provide passivation protection for the device 10.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A vertical cavity surface emitting laser (VCSEL) comprising:
   a substrate;
   a bottom distributed Bragg reflector (DBR) including a plurality of layers deposited on the substrate;
   a first charge confining layer deposited on the bottom DBR;
   an active region deposited on the first charge confining layer;
   a second charge confining layer deposited on the active region;
   a current blocking layer deposited on the second charge confining layer and including a center aperture;
   a top epitaxial DBR including a plurality of top epitaxial DBR layers deposited on the current blocking layer and in the aperture on the second charge confining layer;
   a top electrode deposited on the top epitaxial DBR;
   a bottom electrode deposited on the bottom DBR and adjacent to the active region, wherein a voltage potential provided between the top and bottom electrodes creates a current through the aperture that injects carriers into the active region; and
   a top dielectric DBR including a plurality of dielectric layers deposited on the top epitaxial DBR, the top electrode and the bottom electrode, wherein the top epitaxial DBR and the top dielectric DBR combine to form a complete top DBR.

2. The VCSEL according to claim 1 wherein the active region includes a plurality of quantum well layers.

3. The VCSEL according to claim 2 wherein the plurality of quantum well layers is four quantum well layers where each quantum well layer includes an InGaAs layer sandwiched between two GaAs layers.

4. The VCSEL according to claim 1 wherein the first and second charge confining layers including a plurality of layers having a graded composition to provide a low band gap proximate the active region to a high band gap opposite to the active region.

5. The VCSEL according to claim 4 wherein the graded layers for the first and second charge confining layers are graded AlGaAs layers.

6. The VCSEL according to claim 1 wherein the bottom DBR and the top DBR include a plurality of pairs of high refractive index and low refractive index layers.

7. The VCSEL according to claim 6 wherein the low refractive index layers in the bottom DBR and the top epitaxial DBR are AlGaAs layers, the high refractive index layers in the bottom DBR and the top epitaxial DBR are GaAs layers, the low refractive index layers in the top dielectric DBR are $SiO_2$ and the high refractive index layers in the top dielectric DBR are SiN.

8. The VCSEL according to claim 1 wherein at least some of the bottom DBR layers proximate to the first charge confining layer are doped layers and the top epitaxial DBR layers are doped layers to provide an electrical current path between the top and bottom electrodes.

9. The VCSEL according to claim 1 wherein the top dielectric DBR includes a plurality of SiN and $SiO_2$ evaporated layers.

10. The VCSEL according to claim 1 wherein the first and second charge confining layers, the active region, the current blocking layer and the top epitaxial DBR are fabricated as a mesa on the bottom DBR.

11. The VCSEL according to claim 1 wherein the substrate is a GaAs substrate.

12. The VCSEL according to claim 1 further comprising a buffer layer between the substrate and the bottom DBR.

13. The VCSEL according to claim 1 wherein the top and bottom electrodes are ring electrodes.

14. The VCSEL according to claim 1 wherein the bottom DBR, the first and second charge confining layers, the active region and the top semiconductor DBR are molecular beam epitaxy (MBE) or metal organic chemical vapor deposition (MOCVD) deposited layers.

15. A vertical cavity surface emitting laser (VCSEL) comprising:
    a substrate;
    a bottom distributed Bragg reflector (DBR) including a plurality of layers deposited on the substrate;
    an active region deposited on the bottom DBR; and
    a top DBR deposited on the active region and including a plurality of epitaxial DBR layers and a plurality of dielectric DBR layers.

16. The VCSEL according to claim 15 further comprising a bottom electrode deposited on the bottom DBR and a top electrode deposited on the plurality of epitaxial DBR layers and adjacent to the plurality of dielectric layers.

17. The VCSEL according to claim 15 wherein the top and bottom electrodes are ring electrodes.

18. The VCSEL according to claim 15 wherein the bottom DBR and the top DBR include a plurality of pairs of high refractive index and low refractive index layers.

19. The VCSEL according to claim 18 wherein the low refractive index layers in the bottom DBR and the epitaxial DBR layers are AlGaAs layers, the high refractive index layers in the bottom DBR and the epitaxial DBR layers are GaAs layers, the low refractive index layers in the dielectric DBR layers are $SiO_2$ and the high refractive index layers in the dielectric DBR layers are SiN.

20. A vertical cavity surface emitting laser (VCSEL) comprising:
- a GaAs substrate;
- a buffer layer deposited on the substrate;
- a bottom distributed Bragg reflector (DBR) including a plurality of layers deposited on the buffer layer;
- a first charge confining layer deposited on the bottom DBR;
- an active region deposited on the first charge confining layer, wherein the active region includes a plurality of quantum well layers where each quantum well layer includes an InGaAs layer sandwiched between two GaAs layers;
- a second charge confining layer deposited on the active region, wherein the first and second charge confining layers include a plurality of layers having a graded composition to provide a low band gap proximate the active region to a high band gap opposite to the active region;
- a current blocking layer deposited on the second charge confining layer and including a center aperture;
- a top epitaxial DBR including a plurality of epitaxial DBR layers deposited on the current blocking layer and in the aperture on the second charge confining layer, wherein at least some of the bottom DBR layers proximate to the first charge confining layer are doped layers and the top epitaxial DBR layers are doped layers to provide an electrical current path between the top and bottom electrodes;
- a top electrode deposited on the top epitaxial DBR;
- a bottom electrode deposited on the bottom DBR and adjacent to the active region, wherein a voltage potential provided between the top and bottom electrodes creates a current through the aperture that injects carriers into the active region; and
- a top dielectric DBR including a plurality of dielectric layers deposited on the top epitaxial DBR, the top electrode and the bottom electrode, wherein the top epitaxial DBR and the top dielectric DBR combine to form a complete top DBR.

* * * * *